United States Patent [19]
Oka

[11] Patent Number: 5,976,737
[45] Date of Patent: Nov. 2, 1999

[54] MANUFACTURING METHOD OF SEMICONDUCTOR DEVICES UTILIZING ALIGNMENT OF BED SHOT AND STAGE SHOT THROUGH ROTATION TO ALMOST OVERLAP RESPECTIVE DISTORTIONS

[75] Inventor: Nobuhiko Oka, Nara, Japan

[73] Assignee: Sharp Kabushiki Kaisha, Osaka, Japan

[21] Appl. No.: 09/065,556

[22] Filed: Apr. 24, 1998

[30] Foreign Application Priority Data

Jun. 2, 1997 [JP] Japan ..................................... 9-144352

[51] Int. Cl.⁶ ........................................................ G03F 9/00
[52] U.S. Cl. ................................................. 430/22; 430/30
[58] Field of Search ......................................... 430/22, 30

[56] References Cited

U.S. PATENT DOCUMENTS 5,783,341  7/1998  Uzawa ....................................... 430/22
5,792,580  8/1998  Tomimata ................................. 430/22
5,856,054  1/1999  Tomimata ................................. 430/22

FOREIGN PATENT DOCUMENTS 6-151275  5/1994  Japan .

*Primary Examiner*—Christopher G. Young
*Attorney, Agent, or Firm*—Nixon & Vanderhye, P.C.

[57] ABSTRACT

An alignment sensor measures the distortion of a bed shot, and a processing section compares the measured distortion with a plurality of distortions of the current stage shots stored in a memory device in advance to select the most appropriate current stage shot. According to the selected result, a drive control section drives and rotates the motor, changes the relative angle between the projector lens and the reticle to execute exposure process. This provides, in manufacture of semiconductor devices using a plurality of projection aligners, projection aligners and a method of manufacturing semiconductor devices capable of removing limitations on the number of projection aligners and achieving a high throughput in manufacture.

10 Claims, 12 Drawing Sheets

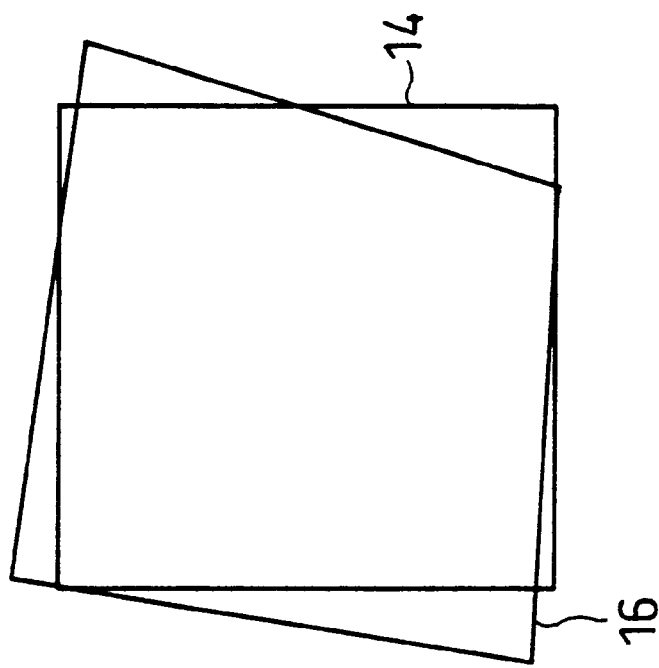
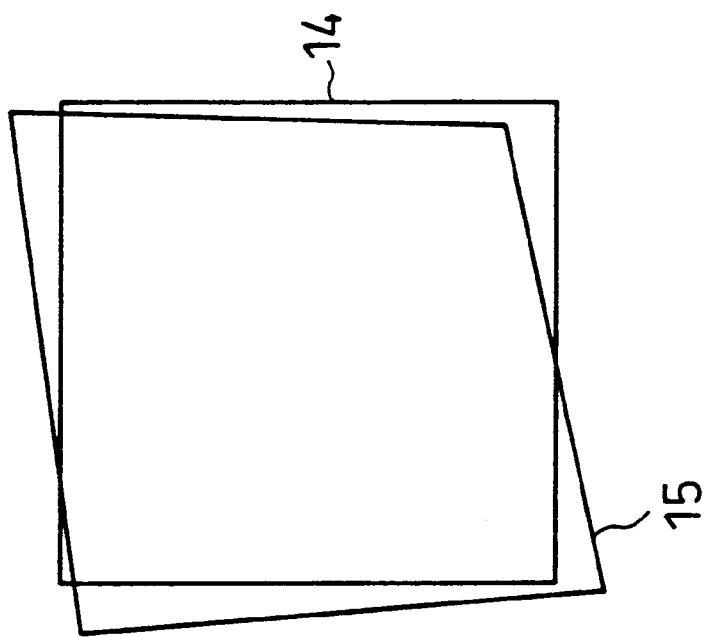
FIG.9(b)
FIG.9(a)

SCALE OF ARROW
(0.05μm)

SCALE OF ARROW
(0.05μm)

SCALE OF ARROW
(0.05μm)

MANUFACTURING METHOD OF SEMICONDUCTOR DEVICES UTILIZING ALIGNMENT OF BED SHOT AND STAGE SHOT THROUGH ROTATION TO ALMOST OVERLAP RESPECTIVE DISTORTIONS

FIELD OF THE INVENTION

The present invention relates to a projection aligner used in a photolithography process for manufacturing semiconductor devices and to a manufacturing method, of semiconductor devices, using such projection aligners, and more particularly to projection aligners for, and a method of, manufacturing semiconductor devices capable of achieving high alignment precision while maintaining a high throughput in mass production.

BACKGROUND OF THE INVENTION

As semiconductor devices are increasingly sophisticated in recent years, extremely fine patterns are formed thereon. However, it is difficult to directly form such extremely fine patterns on a photomask. A solution for this is a projection aligner that includes a photomask having a pattern larger than the actual pattern to be formed on a semiconductor device and projects the pattern of the photomask onto a wafer at a reduced scaling via a projector lens located between the photomask and the wafer.

Although being advantageous in forming fine patterns over the contact aligner that exposes a wafer with a photomask being in direct contact with the wafer, the projection aligner requires an alignment technology, or to be more specific, a technology for optimally adjusting the relative positions of the pattern already formed on the wafer and of a pattern to be formed thereon in a subsequent process.

The alignment process performed by conventional projection aligners is roughly divided into the following three steps.

Step (1): A prealignment section of a wafer loader performs a prealignment process in which the position of the wafer is adjusted by, for example, orientation flat.

Step (2): After the prealignment step, the wafer is loaded on the wafer stage, the focus is automatically set, and then the x- and y-coordinates of the wafer are determined on the wafer stage, using a global alignment mark.

Step (3): A fine alignment process is performed for step and repeat exposure.

In Step (3), Substeps (a) to (f) are executed as below to gauge correction values.

Substep (a): The wafer is measured for a scaling correction value, that is, an enlargement or reduction amount of an area, on the wafer, in which the pattern is already formed. The area will be herein after referred to as a bed shot.

Substep (b): The wafer is measured for an orthogonality correction value, that is, horizontal and vertical displacements of the wafer from the orientation flat.

Substep (c): The wafer is measured for a rotation correction value (rotation value).

Substep (d) : The wafer is measured for offsets in the x and y directions, that is, displacements of the wafer from the bed shot in the x and y directions.

Substep (e): The shot is measured for a scaling correction value. In other words, a pattern area (shot) to be newly formed on the wafer is measured for an enlargement or reduction amount.

Substep (f): The shot is measured for a rotation correction value, that is, for a rotation value of the shot to the bed shot.

The exposure position of the wafer is determined according to the correction values obtained from Substeps (a) to (f). Then alignment is done by means of the scaling correction (see FIG. 16), rotation correction (see FIG. 17), and offset correction.

Nevertheless, since the projection aligner includes a projector lens through which the pattern formed on the reticle is projected onto a wafer, shot distortions due to distortions of the projector lens, on top of the displacements (scaling, rotation, and offset), are inevitable. In other words, the shot projected onto the wafer is distorted by aberration and other deformation of the projector lens. The shot distortion cannot be corrected for by the aforementioned conventional alignment method.

The lens distortion is unique to the projector lens used. If a single projection aligner projects both the bed shot and a shot to be newly formed thereon (hereinafter, will be referred to as a current stage shot), the lens distortion does not vary and therefore results in the same shot distortion, causing no problem. On the other hand, if a different projection aligner is used for each of a series of exposure steps to achieve a high throughput, for example, in mass production of semiconductor devices, adverse effects of the shot distortion become so eminent as shown in FIGS. 16 and 17 that the alignment displacement due to the shot distortion needs be reduced.

Conventionally, if more than one projection aligners are used, each projector lens incorporated in the projection aligners is measured for its distortion in advance, and projection aligners with similar lens distortions were grouped together for actual use (grouping).

Here, such grouping of the projection aligners to reduce the effects of the shot distortion caused by the lens distortion limits the number of projection aligners usable for manufacturing semiconductor devices in large quantities and thus presents an obstacle in achieving a high throughput in manufacture.

SUMMARY OF THE INVENTION

In view of the problem, an object of the present invention is to offer, in manufacture of semiconductor devices using a plurality of projection aligners, projection aligners for, and a method of, manufacturing semiconductor devices that can remove the limitation on the number of projection aligners used and thus achieve a high throughput in mass production by correcting for the shot distortion by the lens distortion.

In order to accomplish the object, the projection aligner in accordance with the present invention is a projection aligner for exposing via a projector lens a pattern formed on a reticle onto a wafer on which a bed shot is already formed, wherein the reticle and the projector lens are disposed to be rotatable, the projection aligner including:

calculating means for calculating a first shot distortion of the bed shot and second shot distortions that vary depending upon a relative angle between the projector lens and the reticle; and rotation control means for rotating either the projector lens or the reticle and the wafer so that the first shot distortion and one of the second shot distortions almost overlap each other.

With the arrangement, the bed shot is already formed on a wafer, and the pattern formed on the reticle is projected onto the bed shot via the projector lens. Here, the calculating means calculates the first shot distortion and the second shot distortions that vary depending upon a relative angle between the projector lens and the reticle. The rotation control means then adjusts the relative angle between the reticle and the projector so that the first shot distortion and the second shot distortion calculated as above almost overlap each other.

The projection aligner can correct for the alignment displacement of the bed shot and the shot to be formed thereon by the projection aligner, and therefore can eliminate the need for grouping of projection aligners with similar lens distortions. Consequently, the projection aligner removes limitations on the number of projection aligners and achieves a high throughput in manufacture.

The method of manufacturing semiconductor devices in accordance with the present invention is for executing each exposure process of a pattern on a reticle via a projector lens by using an individual projection aligner, upon alignment of a bed shot formed by a first projection aligner and a current stage shot to be newly copied onto a wafer by a second projection aligner, the method, comprising the steps of:

(1) calculating a bed shot distortion, a rotation angle of a projector lens of the second projection aligner, and current stage shot distortions varying depending upon a rotation angle of the reticle: and (2) rotating either the projector lens or the reticle and the wafer so that the bed shot distortion and one of the current stage shot distortions almost overlap each other.

With the arrangement, projection aligners project patterns on reticles onto the wafer via projector lenses so that the projected images overlap each other. Upon such exposer process, the distortion of the bed shot and that of the current stage shot are measured. Subsequently, the relative angle between the reticle and the projector lens is adjusted so that the distortion of the bed shot and that of the current stage shot almost overlap each other.

When a plurality of such projection aligners are used in the manufacturing process of semiconductor devices, this method can correct for shot distortions caused by lens distortions, and thereby eliminates the need for grouping of projection aligners with similar lens distortions. Consequently, the method removes limitations on the number of projection aligners and achieves a high throughput in manufacture.

For a fuller understanding of the nature and advantages of the invention, reference should be made to the ensuing detailed description taken in conjunction with the accompanying drawings.

BRIEF DESCRIPTION OF THE DRAWINGS

FIGS. 9(a) and 9(b) are explanatory drawings showing a bed shot and a current stage shot having different inclination angles to the ideal grid.

DESCRIPTION OF THE EMBODIMENTS

The following description will discuss an embodiment in accordance with the present invention.

Figure 1:
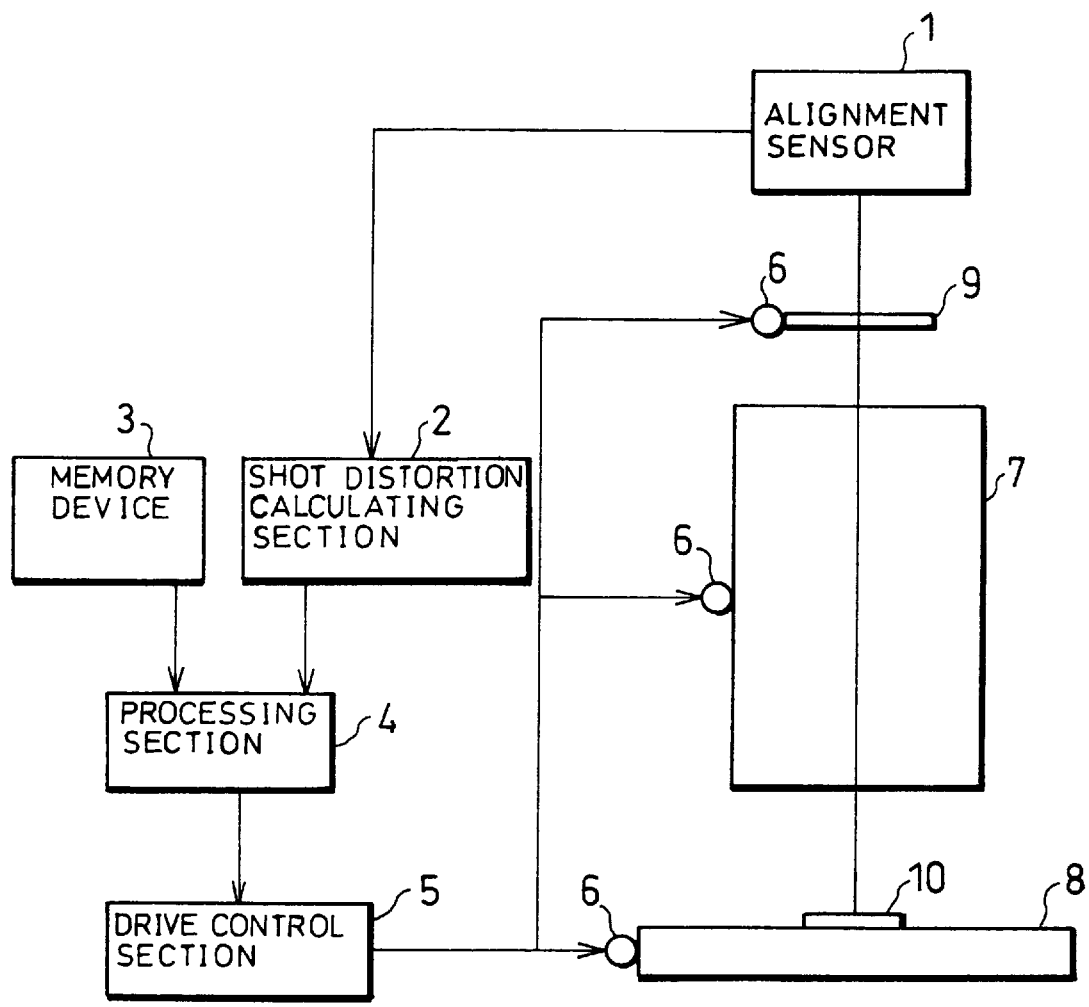
FIG. 1 is a schematic view showing an arrangement of a projection aligner of an embodiment in accordance with the present invention.

A step type projection aligner (hereinafter, will be referred to as a stepper) is used as a projection aligner of the present embodiment. The stepper includes, as shown in FIG. 1, an alignment sensor 1, a shot distortion calculating section 2, a memory device 3, a processing section 4, a drive control section 5, motors 6, a projector lens 7, a stage 8, etc.

The calculating means recited in claims is composed of the alignment sensor 1 and the shot distortion calculating section 2. The rotation driving means recited in claims is composed of the drive control section 5 and the motors 6. The memory device 3 corresponds to the memory means, and the processing section 4 to the rotation component obtaining means.

The alignment sensor 1 measures the relative positions of alignment marks (see FIG. 3) of a bed shot formed on the wafer in a previous step. A measurement signal derived from the alignment sensor 1 is transmitted to the shot distortion calculating section 2 to calculate the shot distortion of the bed shot (hereinafter, will be referred to as the bed shot distortion), i.e. the displacement thereof from an ideal grid.

When the pattern on a reticle 9 is projected onto a wafer 10 by the projection aligner of the present embodiment, there occurs another shot distortion (hereinafter, will be referred to as a current stage shot distortion) due to a distortion of the projector lens 7. Since the current stage shot distortion varies depending upon the relative angle between the reticle 9 and the projector lens 7 at least one of which is disposed to be rotatable, a plurality of current stage shot distortions are measured with various relative angles. Results are stored in the memory device 3. A method of measuring the current stage shot distortion will be explained later in detail.

The bed shot distortion calculated by the shot distortion calculating section 2 is coupled to the processing section 4 which compares the bed shot distortion with all the current stage shot distortions stored in the memory device 3 and thus selects the current stage shot distortion most similar to the bed shot distortion. A method of selecting the current stage shot distortion will be explained later in detail. After selecting the current stage shot distortion, the processing section 4 calculates rotation components of the selected current stage shot distortion and of the bed shot distortion.

The output by the processing section 4, i.e. the rotation component calculated by the processing section 4, is coupled to the drive control section 5. The drive control section 5 rotates, according to the rotation component, either the projector lens 7 or the reticle 9 and wafer 10 (in fact, not the wafer 10 per se, but the stage 8 on which the wafer 10 is placed) by way of the control of the rotation of the motors 6, so that the current stage shot distortion overlaps the bed shot distortion.

After the adjustment of the current stage shot distortion so as to overlap the bed shot distortion in this manner, exposure is performed to form the current stage shot on the wafer 10.

Figure 2:
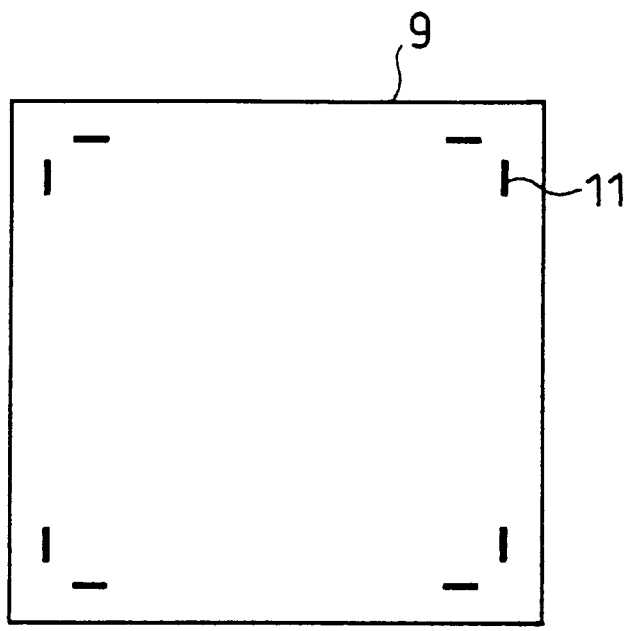
FIG. 2 is an explanatory drawing showing a reticle used for the projection aligner.
Figure 3:
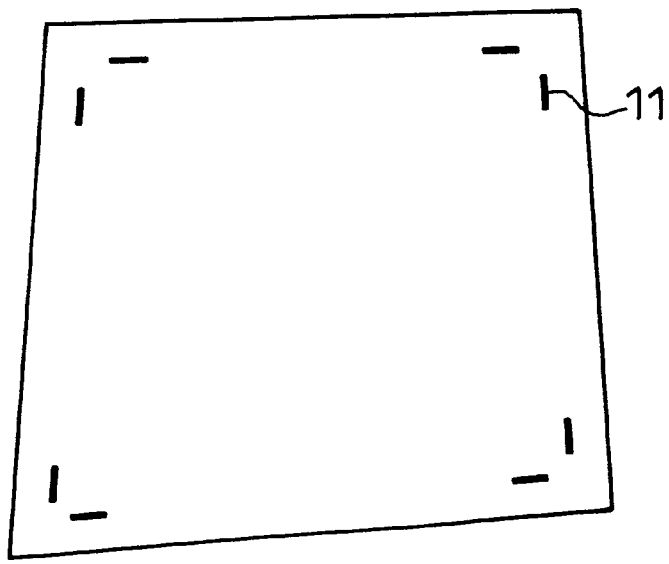
FIG. 3 is an explanatory drawing showing a resultant shot of the reticle being exposed onto a wafer.

The reticle 9 used in the present embodiment has, as shown in FIG. 2, alignment marks 11 on the four corners thereof to represent the vertexes of the rectangular region. As shown in FIG. 3, the alignment marks 11 are projected onto the wafer 10 concurrently with the projection of the bed shot. The bed shot distortion can be determined by measuring the positions of the alignment marks 11.

The following description will explain in detail an alignment method employed by the stepper of the present embodiment.

First, current stage shot distortions caused by the distortion of the projector lens 7 incorporated in the stepper are measured in advance. Now, referring to FIGS. 4(*a*), 4(*b*), 5(*a*), and 5(*b*), a method of measuring the current stage shot distortion will be explained.

Figure 4A:
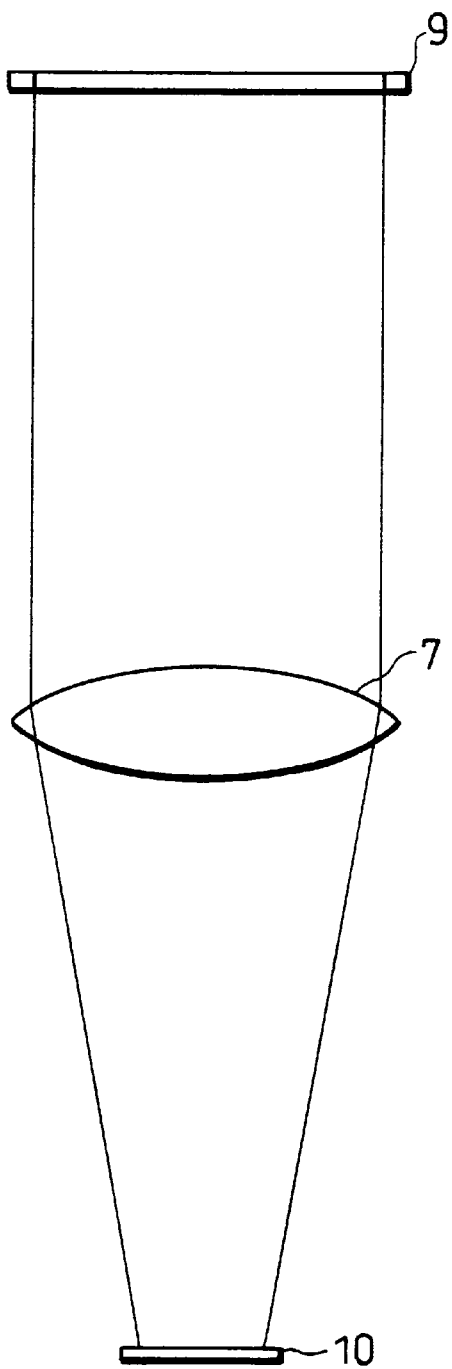
FIGS. 4(a) and 4(b) are explanatory drawings showing a method of measuring a shot distortion caused by a distortion of a projector lens.
Figure 4B:
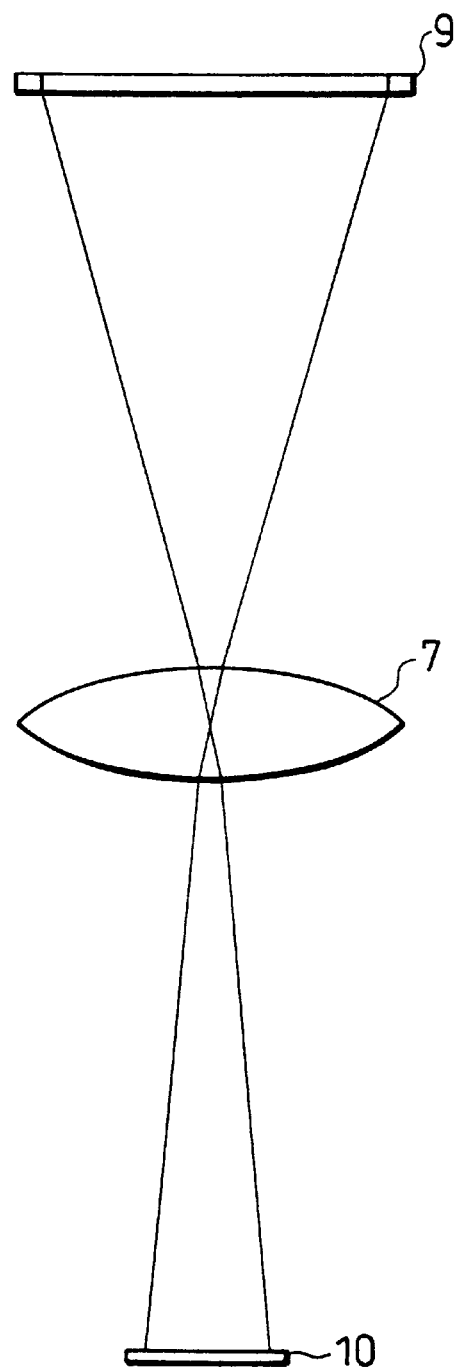
Figure 5A:
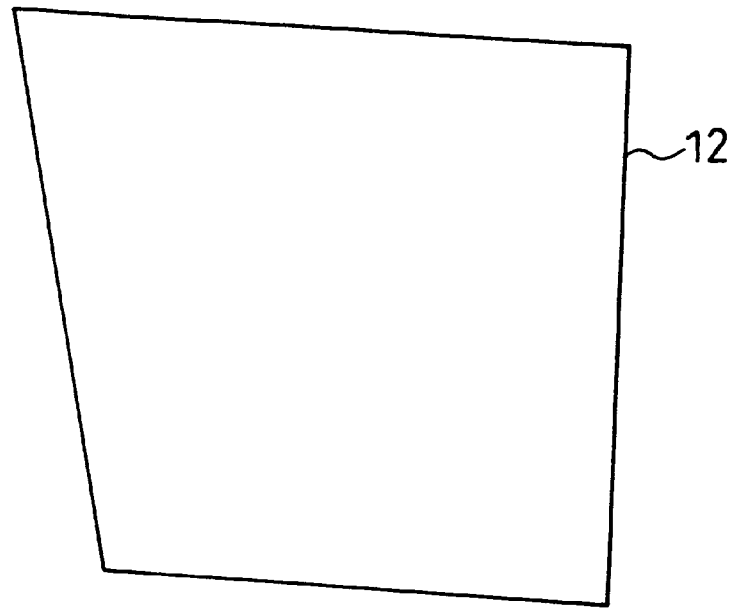
FIGS. 5(a) and 5(b) are explanatory drawings showing a shot on a wafer when the shot distortion is measured.
Figure 5A:
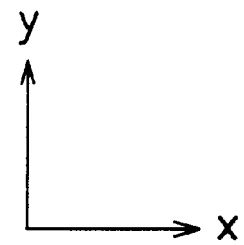
Figure 5B:
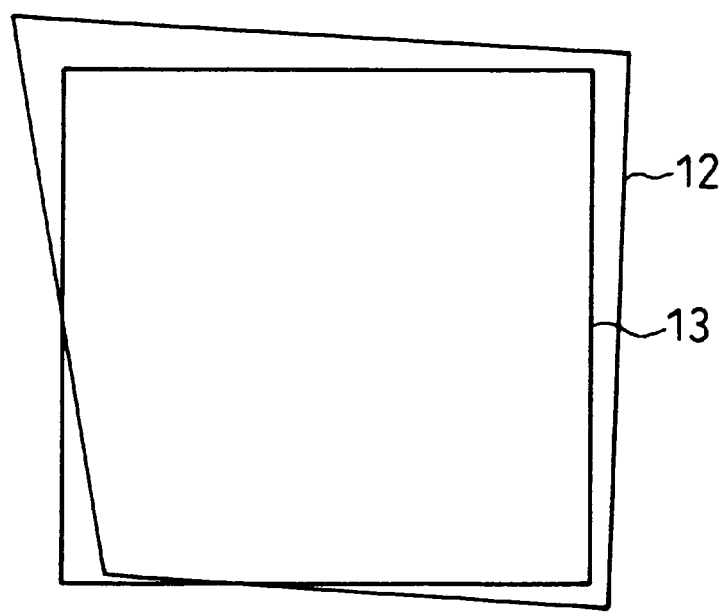

First, as shown in FIG. 4(*a*), the reticle 9 is irradiated with parallel rays of light so that those rays of light having passed through the patterned segment of the reticle 9 pass through the entire body of the projector lens 7, and are directed onto the wafer 10. The resultant shot 12 of the reticle 9 is distorted as shown in FIG. 5(*a*) due to the distortion of the projector lens 7.

Subsequently, as shown in FIG. 4(*b*), the reticle 9 is irradiated with convergent rays of light so that those rays of light having passed through the patterned segment of the reticle 9 converge at the center of the projector lens 7, and are directed onto the same wafer 10 as above. The resultant shot 13 of the reticle 9 is hardly distorted as shown in FIG. 5(*b*), because it is not affected by the distortion of the projector lens 7. The shot 13 therefore can be regarded as an ideal grid.

Since the ideal grid have a perfect rectangular shape, the directions corresponding to two orthogonal sides are defined as x and y directions. The distances in x and y directions are measured between the vertexes of the shot 12 formed on the wafer 10 and the corresponding vertexes of the shot 13 as an ideal grid.

Figure 6:
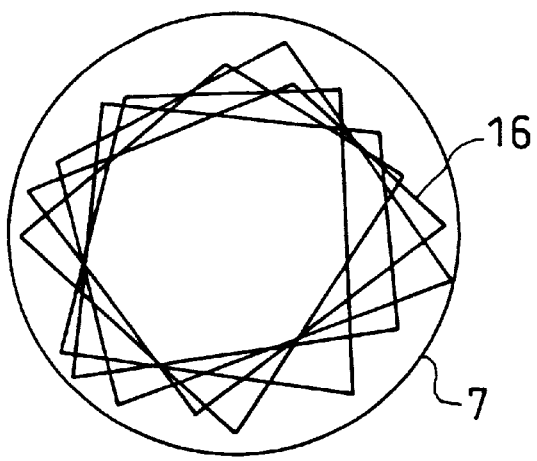
FIG. 6 is an explanatory drawing showing a relation of a projector lens and a shot distortion caused by a distortion of the lens.

The current stage shot distortion that occurs to the shot 12 is caused by the aberration of the projector lens 7, and the shape of the distortion of the shot 12 varies depending upon the relative angle between the reticle 9 and the projector lens 7. Therefore, the measurement of the current stage shot distortion is repeated a plurality of times with various different relative angles with respect to one projector lens 7, or one stepper. FIG. 6 shows the relations between the projector lens 7 and a plurality of measured current stage shot distortions 16. The current stage shot distortions 16 are stored in the memory device 3 as mentioned earlier.

Figure 7:
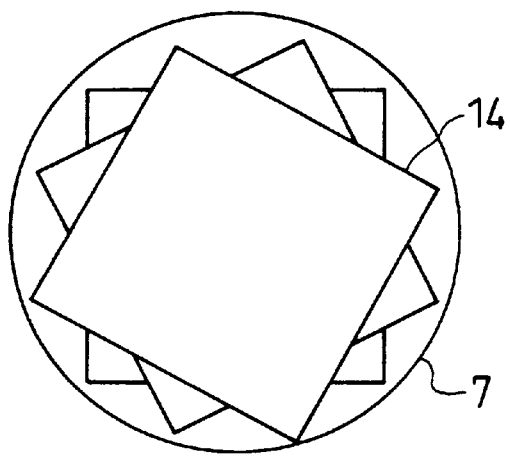
FIG. 7 is an explanatory drawing showing a relation of a projector lens and an ideal grid that acts as a reference for the shot distortion.
Figure 8:
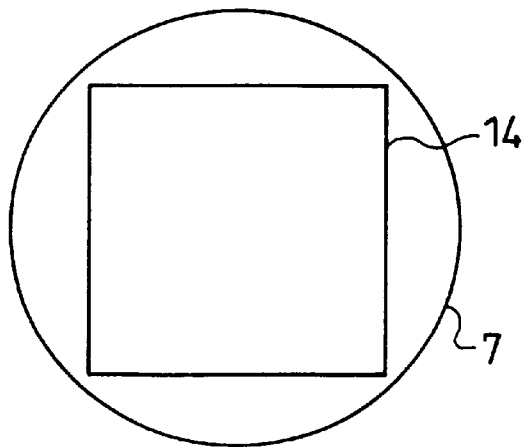
FIG. 8 is an explanatory drawing showing a conventional ideal grid that acts as a reference when the shot distortion is measured.

FIG. 6 shows the reticle 9 and the wafer 10 being rotated instead of the projector lens 7. In such a case, a plurality of ideal grids 14 are also assumed with different relative angles with respect to the projector lens 7 as shown in FIG. 7. On the other hand, conventionally, only one ideal grid 14 is assumed with respect to the projector lens 7 to measure the shot distortion caused by lens distortion as shown in FIG. 8. The vertexes of the shots 12 and 13 represent those determined by the alignment marks 11.

The following description will explain in detail an alignment method employed for the manufacture of semiconductor devices. In the present embodiment, one shot process is assigned to one stepper. In the following description, it is presumed that a bed shot is already formed on the wafer by a stepper in a previous process.

First, the bed shot distortion is measured. The bed shot distortion is denoted in the same manner as the current stage shot distortion by vertex coordinates in x and y directions with the vertexes of an ideal grid as references.

The current stage shot distortion with the smallest difference from the bed shot distortion is selected by comparing the bed shot distortion with all the current stage shot distortions stored in the memory device 3. The following description will explain in detail procedures for comparing the bed shot distortion with the current stage shot distortion.

What matters most in comparing the bed shot distortion with the current stage shot distortion is the current stage shot distortion needs be similar to the bed shot. However, the bed shot distortion and the current stage shot distortion are denoted respectively by vertex coordinates with an ideal grid as a reference. Therefore, a simple comparison of these vertex coordinates results in a recognition that the bed shot 15 and the current stage shot 16 having similar shapes but different inclination angles to the ideal grid 14 have large difference in their shot distortions as shown in FIGS. 9(*a*) and 9(*b*).

Therefore, before comparing the difference between the bed shot distortion and the current stage shot distortion by means of the vertex coordinates, the effects of the inclination angles to the ideal grid 14 need be corrected for. Specifically, for example, vectors are obtained from the center of the ideal grid 14 to the vertexes, and a rotation correction of the current stage shot distortion is carried out so that the angles formed by the vectors of the bed shot 15 and the corresponding vectors of the current stage shot 16 take minimum values.

Figure 10A:
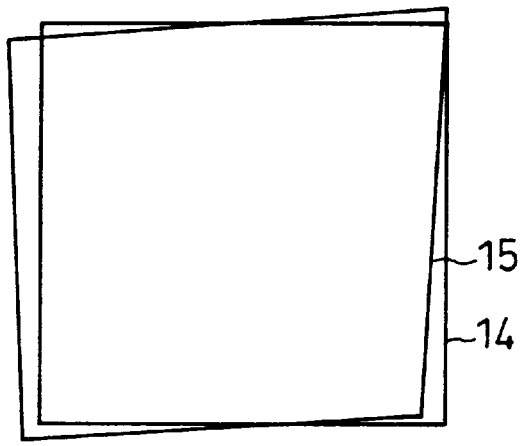
FIGS. 10(a) and 10(b) are explanatory drawings showing a bed shot and a current stage shot having different offsets from the ideal grid.
Figure 10B:
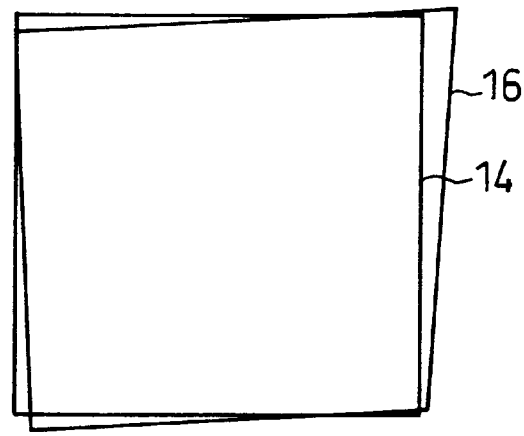
Figure 11A:
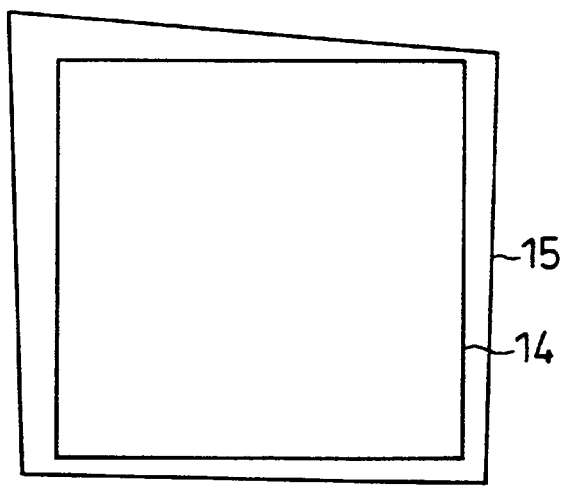
FIGS. 11(a) and 11(b) are explanatory drawings showing a bed shot and a current stage shot having different scalings from the ideal grid.
Figure 11B:
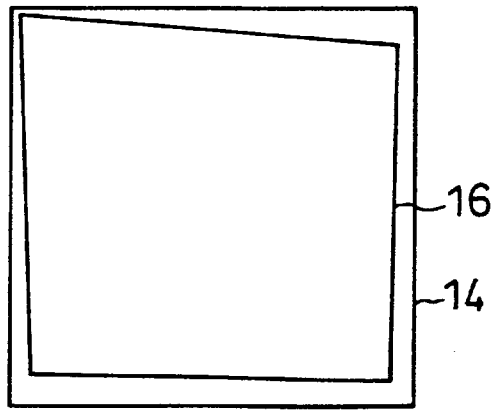

Besides, with respect to the ideal grid 14, there may be a difference in offset between the bed shot 15 and the current stage shot 16 as shown in FIGS. 10(*a*) and 10(*b*), and a difference in scaling therebetween the bed shot 15 and the current stage shot 16 as shown in FIGS. 11(*a*) and 11(*b*). Offset correction and scaling correction are therefore necessary too. No detailed description is given here, since the offset correction and scaling correction here are carried out in the same manner as in the conventional alignment correction.

After completing the rotation correction, the offset correction, and the scaling correction, the difference between the bed shot distortion and the current stage shot distortion is compared by the vertex coordinates. Such comparison is done with all the current stage shot distortions stored in the memory device 3, and the current stage shot 16 is selected that minimize the difference between the bed shot distortion and the current stage shot distortion.

Figure 12:
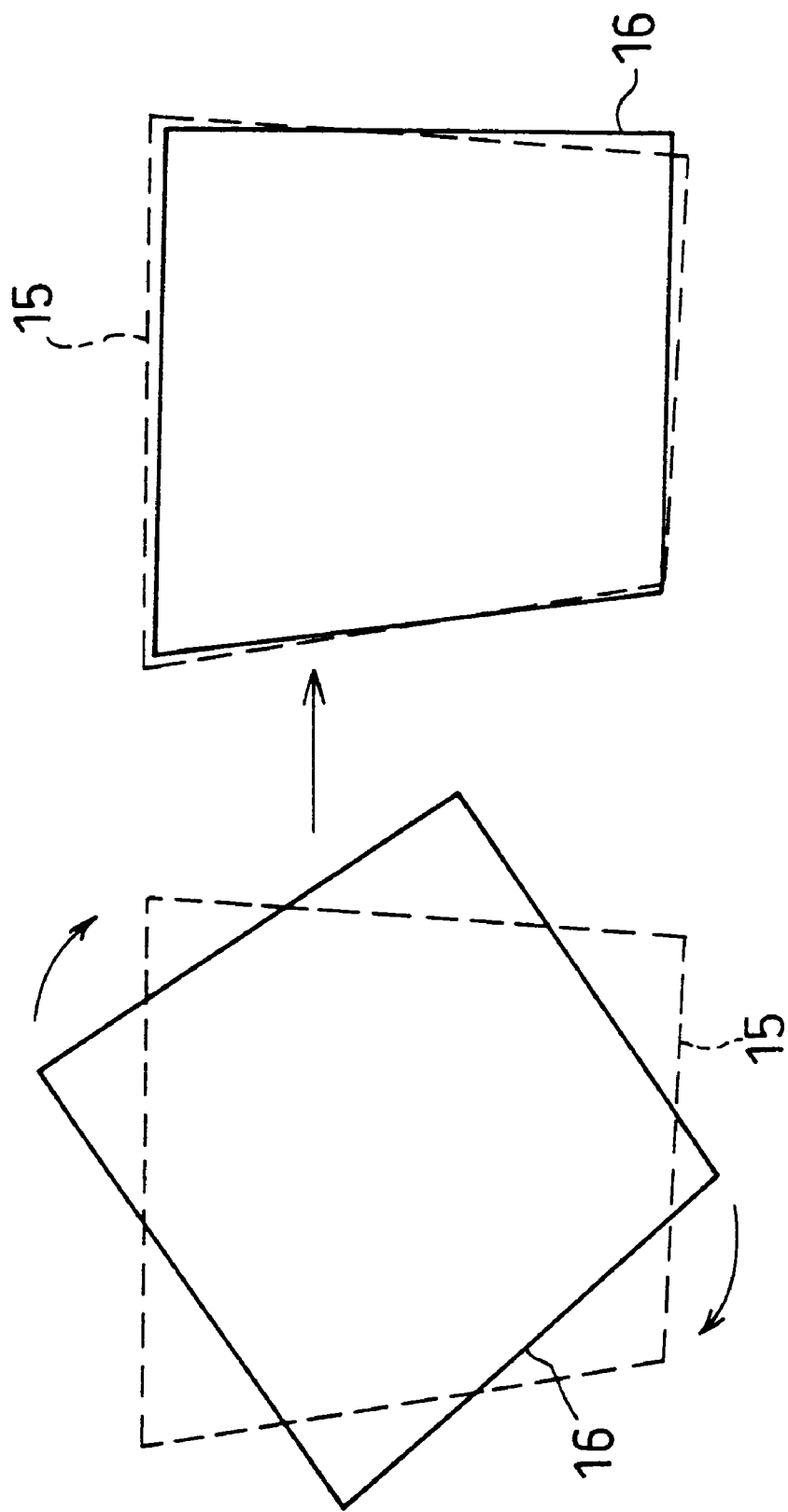
FIG. 12 is an explanatory drawing showing a current stage shot properly overlapping the bed shot as a result of rotation of either a projector lens or a reticle and a wafer.

After selecting the optimum current stage shot 16 in this manner, either the projector lens 7 or the reticle 9 and the wafer 10 is(are) rotated, as shown in FIG. 12, so that the current stage shot 16 properly overlaps the bed shot 15. Thereafter, based on results of calculations for the rotation correction, the offset correction, and the scaling correction, the wafer 10 is moved for exposure with the reticle 9 and the projector lens 7 being fixed.

Figure 13:
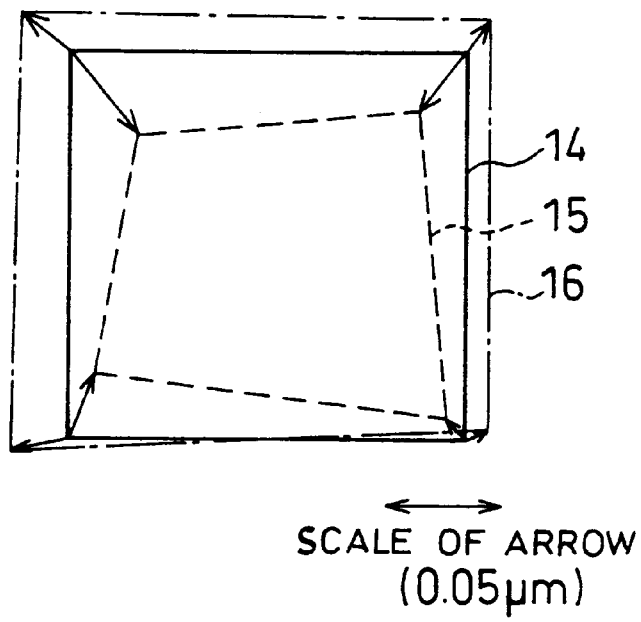
FIG. 13 is an explanatory drawing showing distortions of a bed shot and a current stage shot in relation to an ideal grid.
Figure 14:
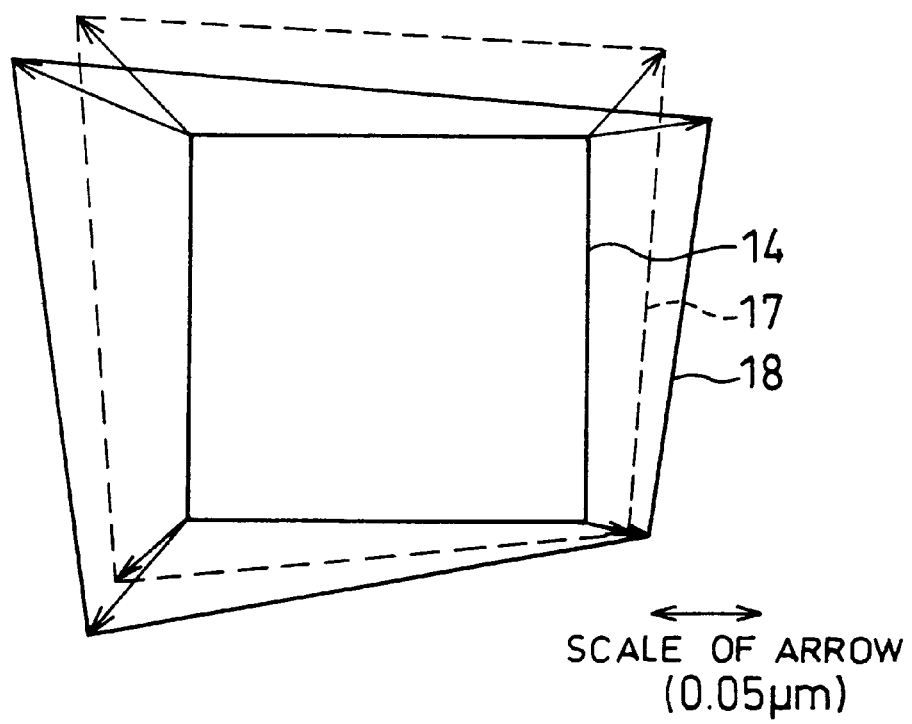
FIG. 14 is an explanatory drawing showing an alignment displacement, of the current stage shot from the bed shot, estimated from the shot distortions shown in FIG. 13, and an alignment displacement, thereof, actually measured after patterning.
Figure 15:
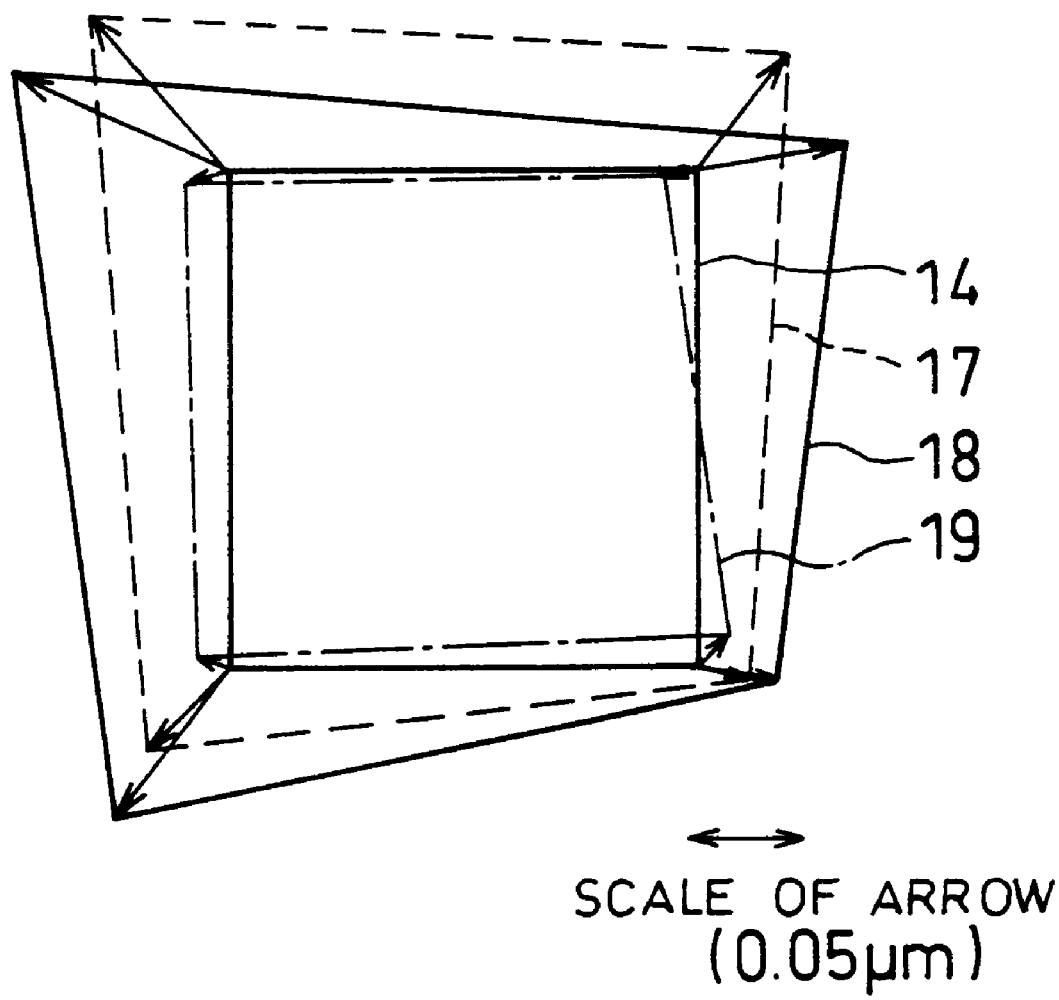
FIG. 15 is an explanatory drawing showing an alignment displacement of the current stage shot from the bed shot after correction is performed to reduce the difference between the bed shot and the current stage shot.
Figure 16:
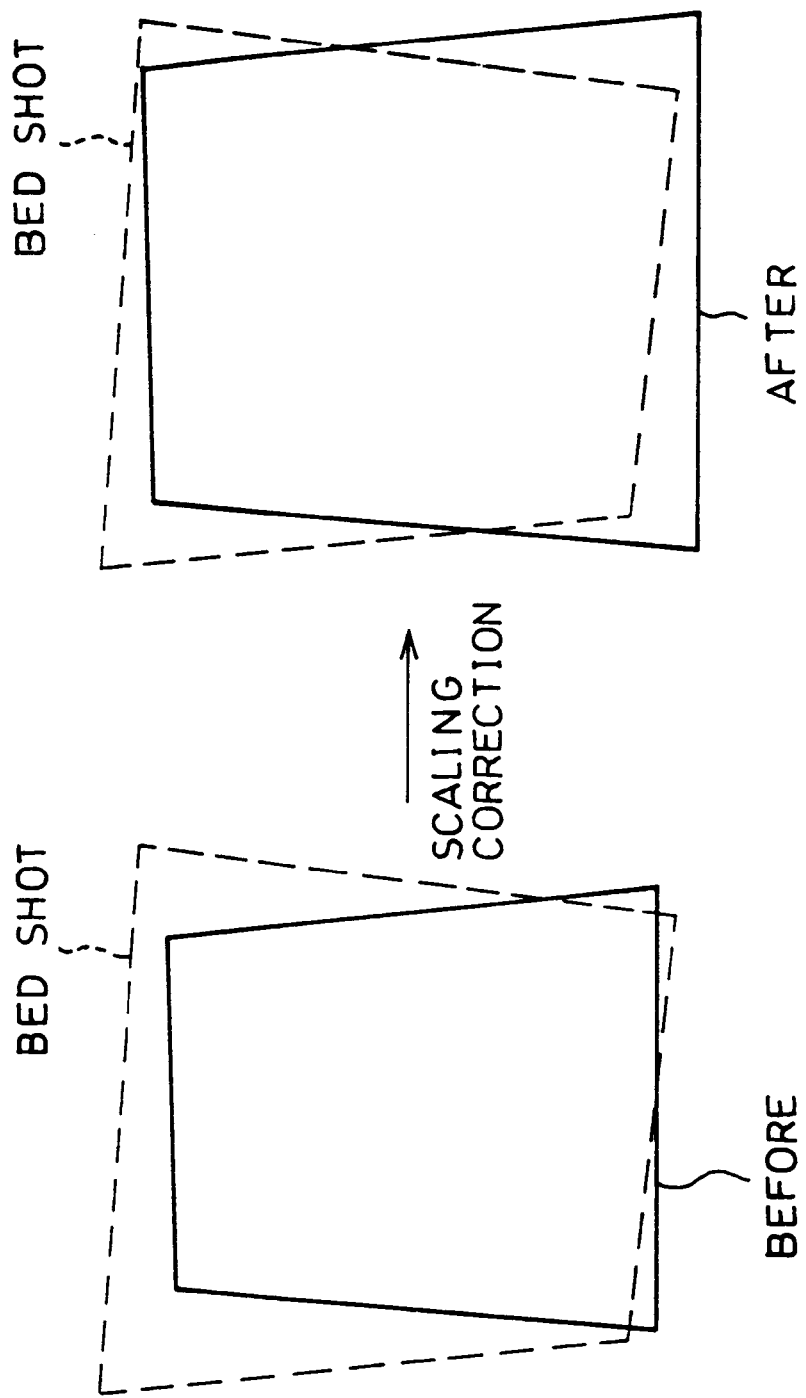
FIG. 16 is an explanatory drawing showing conventional scaling correction in alignment.
Figure 17:
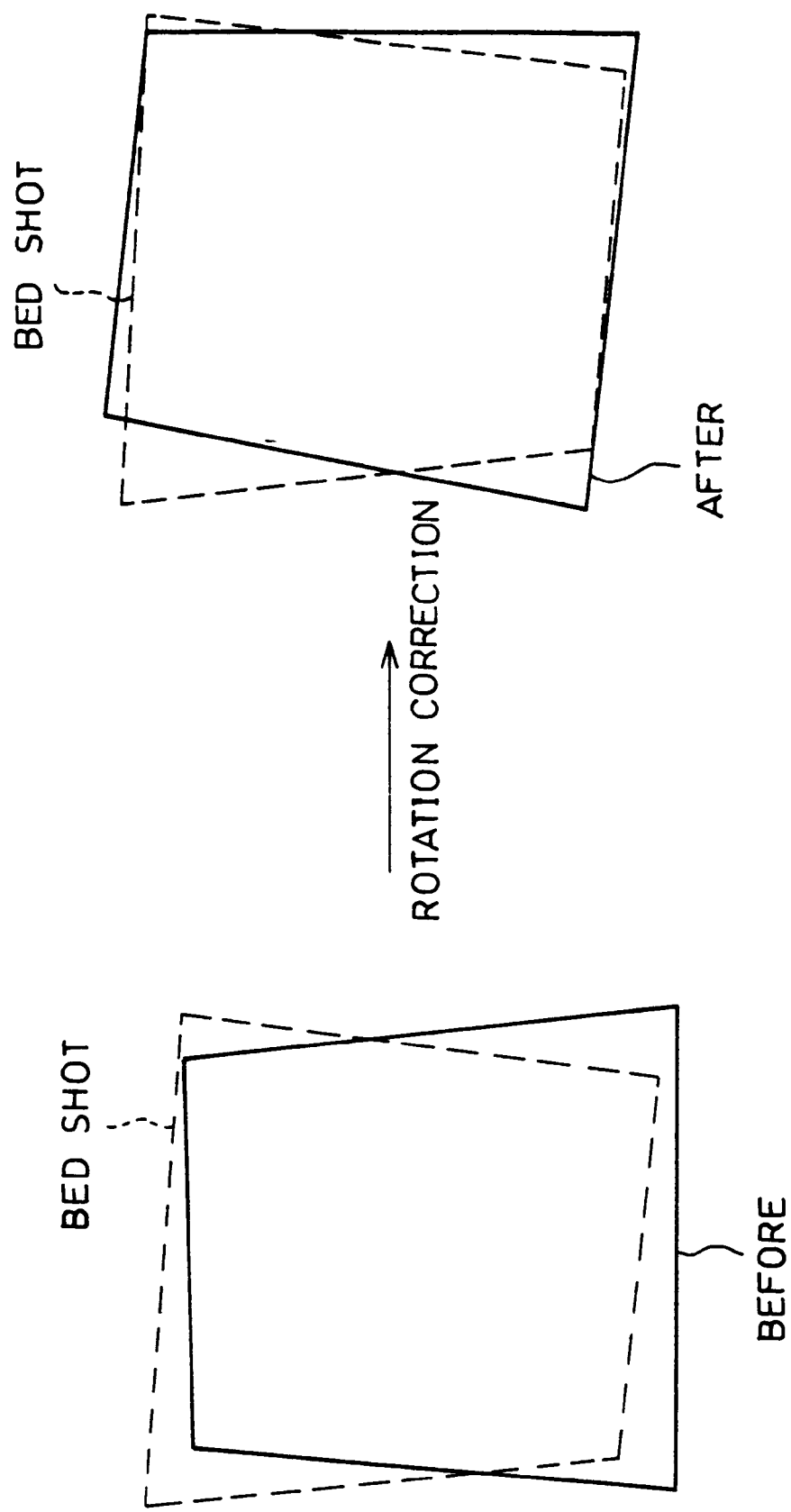
FIG. 17 is an explanatory drawing showing conventional rotation correction in alignment.

According to a conventional alignment method, if the bed shot 15 and the current stage shot 16 are formed as shown in FIG. 13 in relation to the ideal grid 14, the estimated value for the difference between the distortion of the bed shot 15 and the distortion of the current stage shot 16 is represented by the alignment displacement 17 in FIG. 14. The alignment displacement 17 is shown by a shape drawn by adding the vectors between the vertexes of the bed shot 15 and those of the current stage shot 16 to the ideal grid 14. Besides, as shown in FIG. 14, the alignment displacement 17 differs slightly from a alignment displacement 18 that is measured after the actual patterning, due to stepping errors that occur when the wafer 10 is moved from the projection aligner that performs the bed shot and the projection aligner that performs the current stage shot. FIG. 15 shows results of measurement of a alignment displacement 19 by selecting the current stage shot 16 that minimizes the difference between the bed shot distortion and the current stage shot distortion with the projection aligner of the present embodiment.

Table 1 shows alignment displacements 17 estimated according to the conventional technology, alignment displacements 18 measured after the actual patterning, and alignment displacements 19 which resulting from the selection of the current stage shot 16 that minimizes the difference between the bed shot distortion and the current stage shot distortion.

TABLE 1

Alignment Displacements
Estimated, Measured, and Corrected

| Corner of Shot Where Displacement is Measured (coordinates [mm] with the shot center as 0/0) | Direction of Displacement | Alignment Displacement [μm] | | |
|---|---|---|---|---|
| | | 17[1] | 18[2] | 19[3] |
| Upper Left (−7.0/+7.0) | x | −0.058 | +0.026 | −0.011 |
| | y | +0.060 | −0.047 | +0.001 |
| Upper Right (+7.0/+7.0) | x | +0.037 | −0.019 | +0.019 |
| | y | +0.047 | −0.015 | +0.008 |
| Lower Right (+7.0/−7.0) | x | +0.021 | +0.009 | +0.008 |
| | y | −0.008 | +0.005 | −0.013 |
| Lower Left (−7.0/−7.0) | x | −0.041 | +0.012 | −0.005 |
| | y | −0.040 | +0.040 | −0.008 |

Note:
[1]The alignment displacement 17 shows in the estimated value for displacement of the current stage shot from the bed shot.
[2]The alignment displacement 18 shows in the actually measured value for displacement of the current stage shot from the bed shot without correction (conventional technology).
[3]The alignment displacement 19 shows in the actually measured value for displacement of the current stage shot from the bed shot after correction (present invention).

Next, results of measurement when the current stage shot 16 is selected to minimize the difference between the bed shot distortion and the current stage shot distortion are compared with results of measurement when exposure was done according to the conventional technology.

TABLE 2

Improvements on Alignment Displacements

| Corner of Shot Where Displacement | Range of Alignment Displacements [μm] | | |
|---|---|---|---|
| is Measured (coordinates [mm] with the shot center as 0/0, and x/y) | Measured without Correction (Conventional Technology) | Measured after Correction (Present Invention) | Improvements Reductions as % of Alignment Displacements |
| 7.0-x | 0.055 | 0.044 | 20.0% |
| 7.0-y | 0.087 | 0.014 | 83.9% |

Table 2 shows that the correction reduces alignment displacements.

As explained so far, the stepper of the present embodiment can correct for the shot distortion caused by lens distortion, by varying the relative angle between the reticle 9 and the projector lens 7, allowing alignment with high precision. Moreover, when a plurality of such steppers are used in the manufacturing process of semiconductor devices, the steppers do not have to be grouped and can remove the limitation on the number of steppers usable for mass production, thereby achieving a high throughput.

Furthermore, the difference between the bed shot distortion and the current stage shot distortion is compared by way of vertex coordinates after completing rotation correction, offset correction, and scaling correction with respect to an ideal grid. This allows such a current stage shot distortion that the current stage shot is most similar to the bed shot in shape to be surely selected.

As detailed so far, the projection aligner in accordance with the present invention is for exposing via a projector lens a pattern formed on a reticle onto a wafer on which a bed shot is already formed, and is arranged to include:

bed shot distortion detecting means (alignment sensor 1 and shot distortion calculating section 2) for detecting a shot distortion of the bed shot placed on the wafer;

memory means (memory device 3) for storing shot distortions measured by varying the relative angle between the reticle and the projector lens;

comparison and selection means (processing section 4) for comparing the shot distortion of the bed shot detected by the bed shot detecting means with the shot distortions stored in the memory means and for selecting the shot distortion with the least difference from the shot distortion of the bed shot;

rotation component calculating means (processing means 4) for calculating a rotation component between the shot distortion selected by the comparison and selection means and the shot distortion of the bed shot;

driving means (drive control section 5 and motors 6) for driving and rotating either the projector lens or the reticle and wafer according to the rotation component calculated by the rotation component calculating means.

According to the above arrangement, the bed shot distortion detecting means detects the shot distortion of a bed shot. The comparison and selection means compares the shot distortion of the bed shot with the shot distortions stored in the memory means and selects the shot distortion with the least difference from the shot distortion of the bed shot. As the comparison and selection means selects the shot distortion, the rotation component calculating means calculates a rotation component between the shot distortion selected by the comparison and selection means and the shot distortion of the bed shot. The driving means drives and rotates either the projector lens or the reticle and wafer according to the rotation component.

As a result, by changing the relative angle between the projector lens and the reticle, the projection aligner can correct for the alignment displacement between the bed shot and a shot formed thereon by the projection aligner, and therefore eliminate the need to group projection aligners having similar lens distortions. Consequently, the projection aligners remove the limitation on the number of steppers and achieve a high throughput.

The manufacturing method of semiconductor devices in accordance with the present invention is for executing different exposure processes with different projection aligners, and is arranged so that an alignment process of a bed shot already formed on a wafer by a first projection aligner used in a previous process and a shot to be newly copied on the wafer by a second projection aligner includes the steps of:

(1) measuring the alignment displacement of the bed shot;

(2) comparing the alignment displacement of the bed shot measured in the step (1) with shot distortions caused by the projector lens incorporated in the second projection aligner, the shot distortions being measured by varying the relative angle between the reticle and the projector lens and stored in advance in the memory means, and selecting the shot distortion with the least difference from the alignment displacement;

(3) varying the relative angle between the reticle and the projector lens according to the results of the selection in the step (2) so that the newly copied shot overlaps the bed shot properly.

According to the above arrangement, the alignment displacement of the bed shot is measured in the step (1). Subsequently, in the step (2), the alignment displacement is compared with the shot distortions caused by the projector lens incorporated in the second projection aligner, and the shot distortion with the least difference from the alignment displacement is selected. The shot distortions caused by the projector lens incorporated in the second projection aligner vary depending upon the relative angle between the reticle and the projector lens, and therefore the shot distortion is measured in manifold by varying the relative angle, and stored in the memory means. Then in the step (3), the relative angle between the reticle and the projector lens is varied so that the newly copied shot overlaps the bed shot properly.

As a result, when a plurality of such steppers are used in the manufacturing process of semiconductor devices, the shot distortion caused by the lens distortion can be corrected for, and no grouping of projection aligners with similar lens distortions is required. Consequently, the projection aligners remove the limitation on the number of steppers and achieve a high throughput in manufacture.

The manufacturing method of semiconductor devices in accordance with the present invention is preferably further arranged, in addition to the above arrangement, so that the alignment displacement measured in the step (1) and the shot distortions stored in the memory means are denoted by coordinates with the vertexes of an ideal grid acting as the references, the ideal grid producing no shot distortion with respect to the reticle pattern, and that in the step (2), the alignment displacement is compared with the shot distortions by way of the coordinates of the alignment displacement and of the shot distortions that are corrected for respective inclinations of the distortions to the ideal grid.

According to the arrangement, the alignment displacement is compared with the shot distortions by way of coordinates with the ideal grid acting as the reference. Even if the alignment displacement and the shot distortions incline to the ideal grid by different angles, the alignment displacement can be compared with the shot distortions after the inclinations to the ideal grid are corrected for.

Consequently, the arrangement produces, in addition to the effects produced by the previous arrangement, more effects of enabling a proper shot distortion to be selected even if the alignment displacement and the shot distortions incline to the ideal grid by different angles, and thereby achieving a higher throughput in manufacture.

The manufacturing method of semiconductor devices in accordance with the present invention is preferably further arranged, in addition to the above arrangement, so that the alignment displacement measured in the step (1) and the shot distortions stored in the memory means are denoted by coordinates with the vertexes of an ideal grid acting as the references, the ideal grid producing no shot distortion with respect to the reticle pattern, and that in the step (2), the alignment displacement is compared with the shot distortions by way of the coordinates of the alignment displacement and of the shot distortions that are corrected for respective offsets of the distortions to the ideal grid.

According to the arrangement, the alignment displacement is compared with the shot distortions by way of coordinates with the ideal grid acting as the reference. Even if the alignment displacement and the shot distortions have different offsets to the ideal grid, the alignment displacement can be compared with the shot distortions after the offsets to the ideal grid are corrected for.

Consequently, the arrangement produces, in addition to the effects produced by the previous arrangement, more effects of enabling a proper shot distortion to be selected even if the alignment displacement and the shot distortions have different offsets to the ideal grid, and thereby achieving a higher throughput in manufacture.

The manufacturing method of semiconductor devices in accordance with the present invention is preferably further arranged, in addition to the above arrangement, so that the alignment displacement measured in the step (1) and the shot distortions stored in the memory means are denoted by coordinates with the vertexes of an ideal grid acting as the references, the ideal grid producing no shot distortion with respect to the reticle pattern, and that in the step (2), the alignment displacement is compared with the shot distortions by way of the coordinates of the alignment displacement and of the shot distortions that are corrected for respective scalings of the distortions to the ideal grid.

According to the arrangement, the alignment displacement is compared with the shot distortions by way of coordinates with the ideal grid acting as the reference. Even if the alignment displacement and the shot distortions have different scalings to the ideal grid, the alignment displacement can be compared with the shot distortions after the scalings to the ideal grid are corrected for.

Consequently, the arrangement produces, in addition to the effects produced by the previous arrangement, more effects of enabling a proper shot distortion to be selected even if the alignment displacement and the shot distortions have different scalings to the ideal grid, and thereby achieving a higher throughput in manufacture.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A method of manufacturing semiconductor devices, for executing each exposure process of a pattern on a reticle to a wafer via a projector lens by using an individual projection aligner, upon alignment of a bed shot formed by a first projection aligner and a current stage shot to be newly copied onto a wafer by a second projection aligner, the method, comprising the steps of:
(1) calculating a bed shot distortion, a rotation angle of a projector lens of the second projection aligner, and current stage shot distortions varying depending upon a rotation angle of the reticle: and
(2) rotating either the projector lens or the reticle and the wafer so that the bed shot distortion and one of the current stage shot distortions almost overlap each other.

2. The method of manufacturing semiconductor devices as defined in claim 1, wherein the step (2) includes the substeps of:
(a) storing the calculated current stage shot distortions;
(b) selecting one of the current stage shot distortions which is the most similar to the bed shot distortion from memory means and obtaining a rotation component between the bed shot distortion and the selected current stage shot distortion; and
(3) driving either the projector lens or the wafer and the reticle according to the rotation component.

3. The method of manufacturing semiconductor devices as defined in claim 1, wherein the current stage shot distortions are calculated according to planar distances between vertexes of a first projected image and corresponding vertexes of a second projected image, the first projected image being produced by irradiating the reticle with parallel rays of light so that the rays of light having passed through the patterned segment of the reticle are directed onto the wafer via the entire body of the projector lens, the second projected image being produced by irradiating the reticle with convergent rays of light so that the rays of light having passed through the patterned segment of the reticle converge at the center of the projector lens, and are directed onto the wafer via the projector lens.

4. The method of manufacturing semiconductor devices as defined in claim 1, wherein the bed shot distortion and the selected current stage shot distortion are denoted by coordinates with an ideal grid acting as a reference, the ideal grid producing no shot distortion with respect to the pattern on the reticle, and if the bed shot distortion and the current stage shot distortion incline to the ideal grid by different angles, after the different inclinations to the ideal grid are corrected for, either the projector lens or the wafer and the reticle is(are) rotated so that the bed shot distortion and the selected current stage shot distortion almost overlap each other.

5. The method of manufacturing semiconductor devices as defined in claim 4, wherein if the bed shot distortion and the current stage shot distortion have different offsets to the ideal grid, after the different offsets to the ideal grid are corrected for, either the projector lens or the wafer and the reticle is(are) rotated so that the bed shot distortion and the selected current stage shot distortion almost overlap each other.

6. The method of manufacturing semiconductor devices as defined in claim 4, wherein if the bed shot distortion and the current stage shot distortion have different scalings to the ideal grid, after the different scalings to the ideal grid are corrected for, either the projector lens or the wafer and the reticle is(are) rotated so that the bed shot distortion and the selected current stage shot distortion almost overlap each other.

7. The method of manufacturing semiconductor devices as defined in claim 1, wherein the bed shot distortion and the selected current stage shot distortion are denoted by coordinates with an ideal grid acting as a reference, the ideal grid producing no shot distortion with respect to the pattern on the reticle, and if the bed shot distortion and the current stage shot distortion have different offsets to the ideal grid, after the different offsets to the ideal grid are corrected for, either the projector lens or the wafer and the reticle is(are) rotated so that the bed shot distortion and the selected current stage shot distortion almost overlap each other.

8. The method of manufacturing semiconductor devices as defined in claim 7, wherein if the bed shot distortion and the current stage shot distortion have different scalings to the ideal grid, after the different scalings to the ideal grid are corrected for, either the projector lens or the wafer and the reticle is(are) rotated so that the bed shot distortion and the selected current stage shot distortion almost overlap each other.

9. The method of manufacturing semiconductor devices as defined in claim 1, wherein the bed shot distortion and the selected current stage shot distortion are denoted by coordinates with an ideal grid acting as a reference, the ideal grid producing no shot distortion with respect to the pattern on the reticle, and if the bed shot distortion and the current stage shot distortion have different scalings to the ideal grid, after the different scalings to the ideal grid are corrected for, either the projector lens or the wafer and the reticle is(are) rotated so that the bed shot distortion and the selected current stage shot distortion almost overlap each other.

10. The method of manufacturing semiconductor devices as defined in claim 5, wherein if the bed shot distortion and the current stage shot distortion have different scalings to the ideal grid, after the different scalings to the ideal grid are corrected for, either the projector lens or the wafer and the reticle is(are) rotated so that the bed shot distortion and the selected current stage shot distortion almost overlap each other.

* * * * *